Dec. 28, 1965

T. M. ELFVING 3,226,602

HEAT TRANSFERRING MOUNTING PANELS FOR ELECTRIC COMPONENTS AND CIRCUITS

Filed Oct. 29, 1962

7 Sheets-Sheet 1

INVENTOR.
THORE M. ELFVING
BY
Flehr and Swain
ATTORNEYS

Dec. 28, 1965

T. M. ELFVING 3,226,602

HEAT TRANSFERRING MOUNTING PANELS FOR ELECTRIC COMPONENTS AND CIRCUITS

Filed Oct. 29, 1962

7 Sheets-Sheet 2

INVENTOR.
THORE M. ELFVING
BY
Flehr and Swain
ATTORNEYS

Dec. 28, 1965 T. M. ELFVING 3,226,602

HEAT TRANSFERRING MOUNTING PANELS FOR ELECTRIC COMPONENTS AND CIRCUITS

Filed Oct. 29, 1962

7 Sheets-Sheet 3

INVENTOR.
THORE M. ELFVING
BY
Flehr and Swain
ATTORNEYS

Dec. 28, 1965 T. M. ELFVING 3,226,602

HEAT TRANSFERRING MOUNTING PANELS FOR ELECTRIC COMPONENTS AND CIRCUITS

Filed Oct. 29, 1962 7 Sheets-Sheet 4

INVENTOR.
THORE M. ELFVING
BY Flehr and Swain
ATTORNEYS

Dec. 28, 1965

T. M. ELFVING 3,226,602

HEAT TRANSFERRING MOUNTING PANELS FOR ELECTRIC COMPONENTS AND CIRCUITS

Filed Oct. 29, 1962

7 Sheets-Sheet 5

INVENTOR.
THORE M. ELFVING

BY Flehr and Swain

ATTORNEYS

Dec. 28, 1965

T. M. ELFVING 3,226,602

HEAT TRANSFERRING MOUNTING PANELS FOR ELECTRIC COMPONENTS AND CIRCUITS

Filed Oct. 29, 1962

7 Sheets-Sheet 6

INVENTOR.
THORE M. ELFVING

BY Flehr and Swain

ATTORNEYS

Dec. 28, 1965

T. M. ELFVING 3,226,602

HEAT TRANSFERRING MOUNTING PANELS FOR ELECTRIC COMPONENTS AND CIRCUITS

Filed Oct. 29, 1962

7 Sheets-Sheet 7

INVENTOR.
THORE M. ELFVING
BY
Flehr and Swain
ATTORNEYS 3,226,602

HEAT TRANSFERRING MOUNTING PANELS FOR ELECTRIC COMPONENTS AND CIRCUITS

Thore M. Elfving, 433 Fairfax Ave., San Mateo, Calif.

Filed Oct. 29, 1962, Ser. No. 233,636
12 Claims. (Cl. 317—100)

The present invention relates to heat transferring mounting panels for electronic components and circuits such as power transistors, klystrons, vacuum tubes and other electronic tubes as well as for so-called printed circuit assemblies and circuit packages. The invention relates more particularly to hermetic heat transfer systems with their heat dissipating portion separated in space from the electronic components to be cooled and to one-way heat transfer systems in combination with thermoelectric heat pumps and other heat sinks.

It is a general object of the present invention to provide an improved cooling system for electronic components, circuits and parts.

It is another object of this invention to provide thin double-walled mounting shelves, panels or consoles serving as effective heat absorbing surfaces for electronic components clamped thereto.

It is another object to provide sandwich printed circuit panels with built-in cooling system.

It is another object of this invention to provide heat transferring double-walled mounting shelves or panels serving as heat sinks for electronic components mounted thereon to dissipate heat to surrounding air from greatly enlarged surfaces located a considerable distance from the mounting place.

It is still another object of this invention to provide thermoelectric heat pump systems effectively cooling thin mounting shelves and panels of the type having a double-walled hermetically closed heat transfer system with a surface configuration allowing convenient bracketing or clamping of electric components thereto.

Additional objects and features of the invention will appear from the following description in which several embodiments of the invention are described with reference to the accompanying drawings.

Referring to the drawings.

Figure 1:
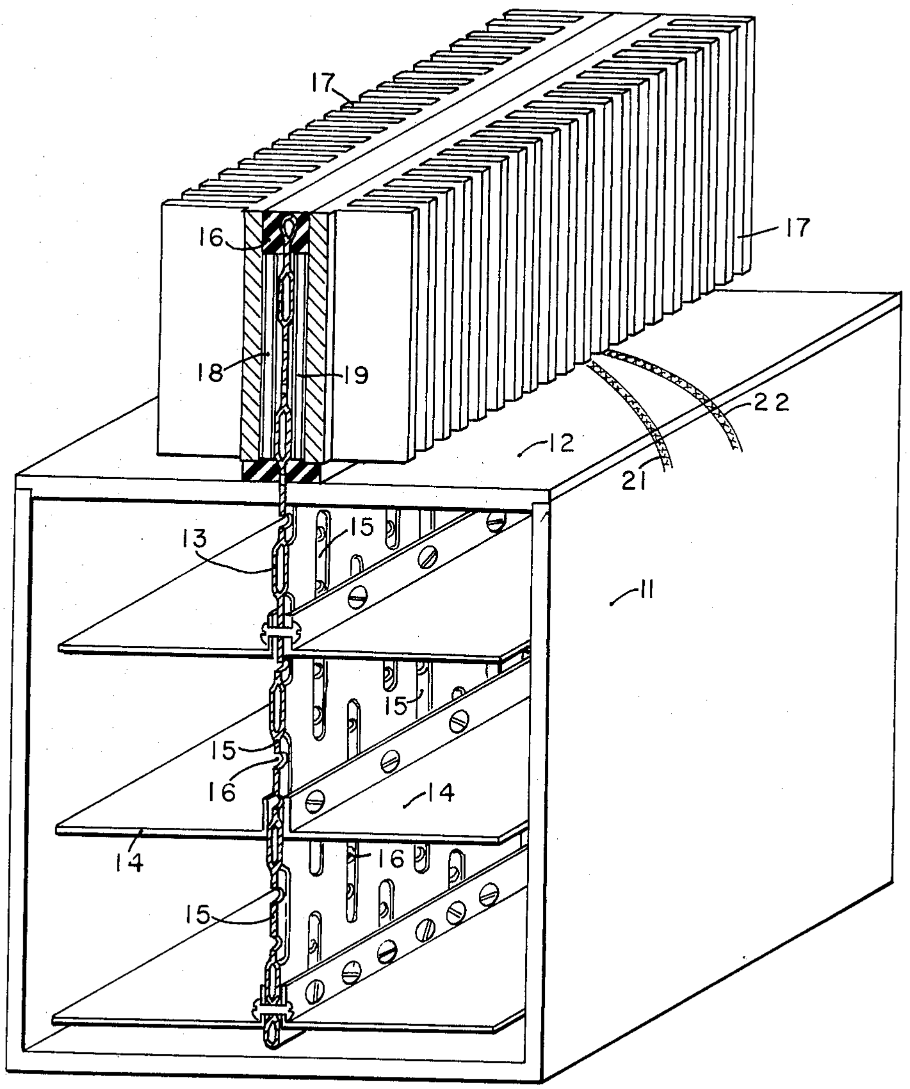
FIGURE 1 is a perspective view of an electronic circuit assembly box or cabinet cooled by a thermoelectric heat pump assembly.

FIGURE 1 shows a sectional view of a closed mounting box or cabinet for electronic circuits cooled by an outside thermoelectric heat pump. The cabinet 11 includes a top wall 12. A double-walled heat transferring panel 13 extends into the cabinet through the top as illustrated. The hermetically closed double-walled heat transferring panel 13 is partly filled with a volatile liquid such as a refrigerant and is provided with metal mounting shelves 14 in direct thermal contact with the panel walls. The walls of the panel 13 are joined at a multitude of spaced contact areas 15. Holes 16 can be drilled through the panel at the contact areas 15 without interfering with the hermetic system. Shelves 14 are shown bolted to the panel 13 through holes formed at the contact areas.

The lower portion of the panel 13 constitutes the heat absorbing portion of a closed heat transfer system while the upper portion 16 of the same panel serves as the heat dissipation portion of the same system.

Fin radiators 17 are disposed on each side of the heat dissipating portion 16 to provide extended heat dissipating surfaces to the ambient air. The fin radiators 17 can be directly clamped in good thermal contact with the upper panel portion 16, in which case the heat transfer panel 13 is maintained at a temperature above that of the ambient air.

In FIGURE 1, there is interposed between the fin radiators and the double-walled panel 13, thermoelectric heat pumps comprising two thermocouple assemblies 18 and 19 with their cold junction sides in thermal contact with the heat dissipating portion 16 of the heat transfer panel 13 and with their hot junction sides in direct thermal contact with the radiators 17.

The thermocouple assemblies 18 and 19 are supplied with direct current energy through the leads 21 and 22 and can be intermittently energized by a thermostat in a known way for keeping a constant temperature in the box 11. By using a thermoelectric heat pump device in combination with the heat transferring mounting panel, it is possible to keep the temperature of the panel below the ambient air temperature. This results in more efficient cooling of the components mounted in the cabinet. The components can be mounted on the horizontal shelves 14 or clamped directly to the panel 13 for cooling by conduction to the panels.

The lower portion of the panel, being filled with a volatile refrigerant, will absorb heat from the components by boiling of the refrigerant. The refrigerant vapor condenses in the upper portion of the panel where the heat is dissipated to the cold junctions of the thermoelectric heat pumps 18 and 19 and pumped to the hot junction side where it will be dissipated to the air through the radiators at a higher temperature determined by the amount of absorbed heat and the size of the radiators. The condensed refrigerant flows by gravity back to the heat absorbing lower portion of the panel wetting the walls of the whole panel section inserted in the box. In this manner, the entire panel 13 serves as a heat absorbing portion regardless of the amount of refrigerant in the system.

Figure 2:
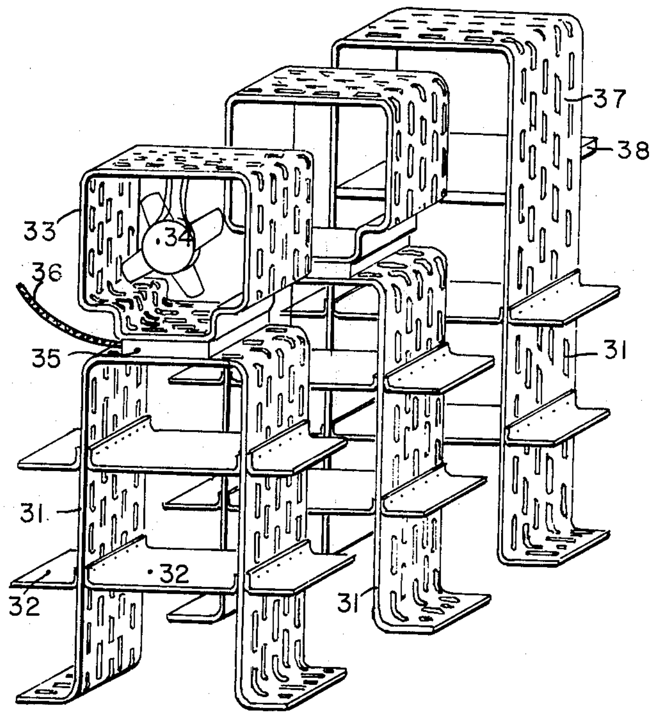
FIGURE 2 is a perspective view of a heat transferring panel or shelf system for the mounting of electronic components.

Heat transfer mounting consoles for electronic equipment comprising sections of U-shaped double-walled panels 31 are shown in FIGURE 2. The panels form mounting racks capable of effectively cooling the equipment mounted therein by conduction without forced air circulation or water cooling. The U-shaped panels 31 are hermetically closed and partly filled with a refrigerant which serves as the heat transferring medium. Electronic components can either be placed or clamped directly to horizontal or vertical portions of the double-walled panels or placed on shelves 32 which are mounted on and in thermal contact with the panels. The heat absorbing panels 31 may be mounted inside an electronic control or equipment room and combined with heat dissipating portions of the system located outside, preferably on top of the ceiling.

FIGURE 2 shows to alternatives for the final heat dissipation. The first alternative shows a heat dissipating duct section 33 cooled by a fan 34 and thermally connected with the heat absorbing panel 31 through a thermoelectric heat pump 35 energized through the direct current leads 36. As illustrated in the figure, several such sections can be placed in a row to be cooled by a fan 34. In an other alternative, the heat dissipation takes place in an extended portion 37 of the panel 31, which portion is located above the ceiling or partition 38. There is formed in combination with the ceiling an air duct cooled by the common fan 34.

In the first alternative, the refrigerant vapor formed by the heat absorbed by the panel 31 is condensed at the cold junction side of the heat pump 35 and the heat is delivered at the hot junction side of the heat pump 35 to the duct section 33 which comprises a double-walled hermetically sealed heat transfer panel. The section 33 serves as an air cooled heat sink for the system. In this case, the panel 31, if properly insulated, can be kept at a temperature below that of the ambient air.

In the second alternative, the extended portion 37 of the panel 31 will dissipate heat at a temperature determined by the load on the panel 31 and the cooling capacity of the extended portion 37 when ambient air is blown through the air duct. The panel 31 and the extended portion 37 of the same will attain substantially the same temperature.

The panels 31 and the heat dissipating ducts 33 are, according to the invention, made from a pair of aluminum sheets with the surfaces which face each other joined or bonded at a multitude of areas distributed over the panel. The bonded areas can be provided with holes for fastening of clamping and bracketing means serving to conduct heat from the mounted equipment to the double-walled hermetically closed heat transfer system created by the panel. The heat dissipating duct 33 and the extended portion 37 are preferably painted to increase heat radiation. The heat dissipation by natural convection and radiation from the outside of said painted members will, in most cases, be sufficient for preventing overheating and damage in case of fan failure.

Figure 3:
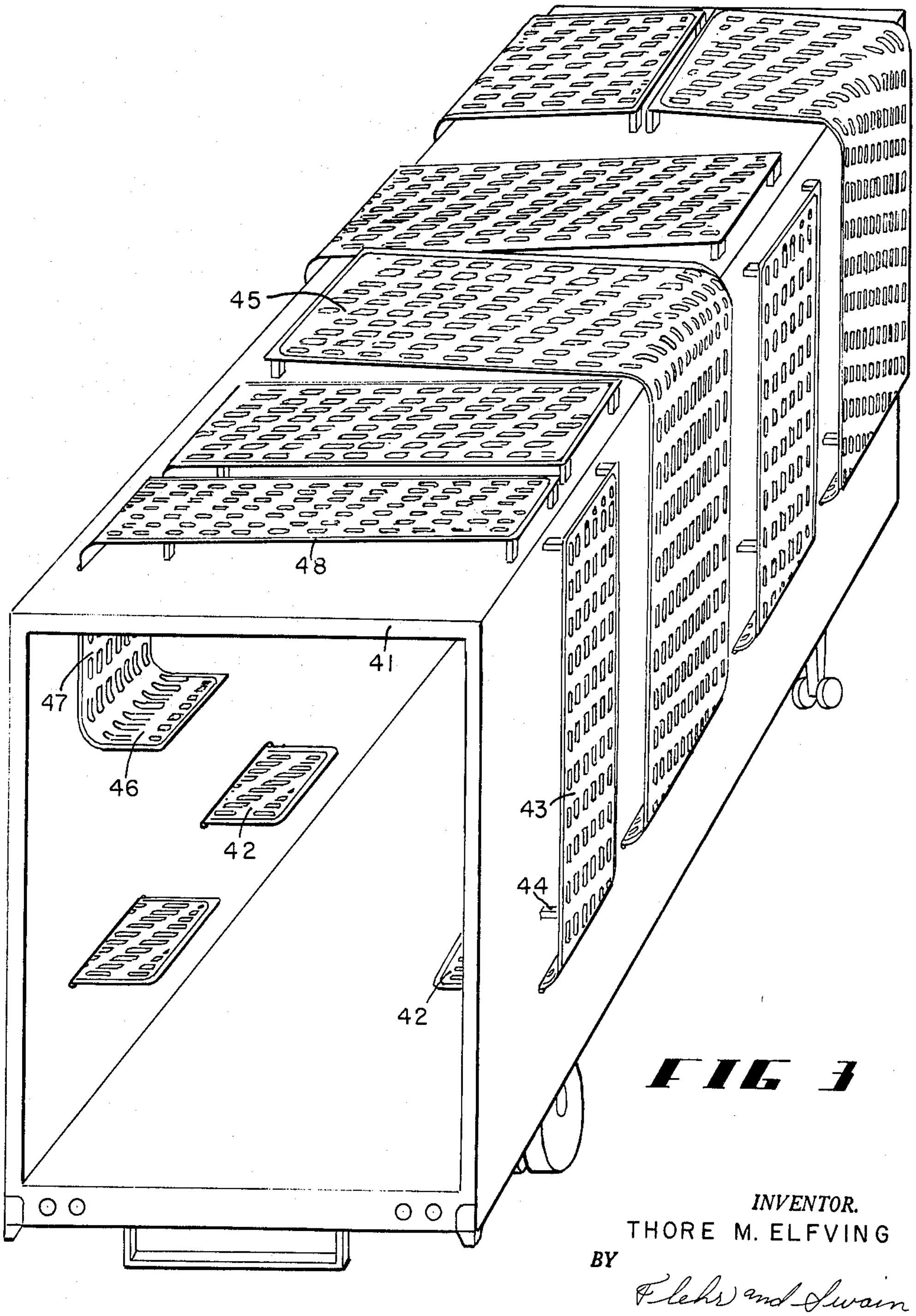
FIGURE 3 is a perspective view of a transportable electronic center equipped with component cooling means according to the invention.

FIGURE 3 shows a transport van used as an electronic center or equipment unit provided with cooling means according to the invention. Preferably, along the inside walls of the van 41 are arranged heat transferring mounting shelves 42 comprising double-walled hermetically sealed panels partly filled with a volatile liquid. The double-walled heat absorbing shelves 42 extend to the outside of the van and upwardly along the side to form vertical heat dissipating panel portion 43. The heat dissipating portions are spaced from the outside wall of the van by brackets 44. This allows air to circulate by convection on both sides of the panels. If necessary, the vertical outside wall panel portions may extend over the roof to form a horizontal portion 45 secured by brackets or the like. An alternative is to have the heat absorbing portion of the heat transferring mounting panel include both a horizontal and a vertical section 46 and 47, respectively. The vertical section 47 extends through the ceiling and continues over the roof as a horizontal heat dissipating roof panel 48. Electronic equipment can be cooled by clamping to section 46 or 47, whichever is most convenient. Again, the outside panel portions are preferably painted for maximum heat dissipation by radiation. A light color will reduce heat absorption from sun rays while permitting radiation of long wave heat rays.

The heat transferring mounting panels are preferably made from aluminum and the inside shelves 42 can remain unpainted in order to reduce heat dissipation by radiation to the inside air. This can also be achieved by insulating the inside portion of the shelves 42 not occupied by equipment.

Thus, the outside of the van is used for cooling inside equipment without the use of cooling water or forced air and with minimum heating of the inside space. The inside heat absorbing portion 42 of the heat transfer panels can, according to the invention, be both vertical and horizontal with or without additional metal heat conducting shelves or brackets projecting therefrom.

As the heat transferring medium in the hermetically sealed panels, ordinary refrigerants such as Freons of various types can be used. When the temperature of the equipment or parts which have to be cooled is very high, for instance, anodes with an allowed temperature as high as +250° C., the heat transferring medium can suitably be a low pressure liquid such as distilled water. When water is used, an anticorrosive agent such as sodium chromate is preferably added to the filling.

Figure 4:
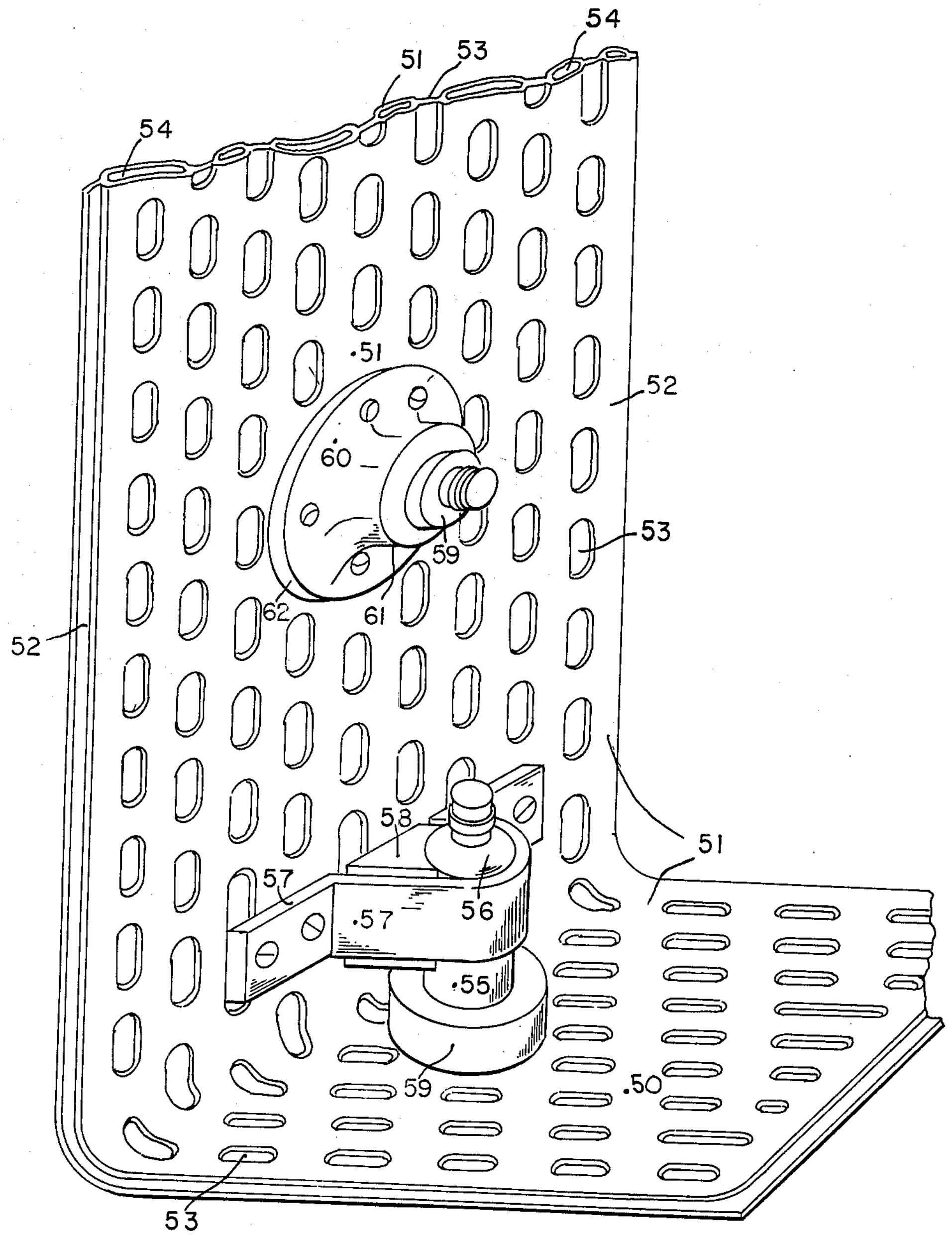
FIGURE 4 is a perspective view, partly broken away, of a double-walled heat transferring and heat dissipating mounting panel according to the invention for the cooling of components operating at temperatures considerably higher than the ambient air.

FIGURE 4 shows in a perspective view a heat transferring mounting shelf with electronic equipment mounted thereon. The shelf 50 comprises a double-walled heat transferring panel 51 with sealed edges 52 and with the walls joined at distributed contact areas 53 to form a multitude of intercommunicating cavities 54 serving as evaporators, condensers and passages for a liquid refrigerant partly filling the hermetically closed panel 51. The lower heat absorbing boiler or evaporator portion of the system where liquid refrigerant is present and where heat absorption takes place by boiling or evaporation of the refrigerant when heated equipment is mounted thereon is shown in the figure. The drawing shows an electronic tube 55 placed on the horizontal portion 50 with its anode 56 clamped to the vertical portion of the panel 51 by the heat conducting clamp 57. The heat conducting support 58 also provides means for transferring heat to the panel 51. The clamp 57 is firmly fastened to the panel by bolts 58 through adjacent contact areas 53 in which holes can be drilled without interfering with the hermetic system. The tube 55 can also have its socket 59 in heat transfer relationship with the panel.

The tube 55, with its hot anode 56, is cooled by conduction through the clamp 57 and the metal support 58 to the panel 51 in which heat is absorbed by boiling of the refrigerant. Other intermediate heat transfer means may be employed; for example, another vapor heat transfer system. The vapor formed by the boiling refrigerant is immediately spread all over the heat dissipating upper portion of the panel which assumes the same temperature as the boiling portion. The heat is dissipated to the surrounding ambient air first by condensation of refrigerant on the inner wall and finally by natural convection and radiation at the outside panel wall. In this way, a hot component can be cooled by conduction instead of forced air even if large quantities of heat are involved. As an illustration, it can be mentioned that a panel of the type described having a width of one foot and length of five feet has a total outside surface of approximately 10 square feet. It can dissipate 1500 watts with a temperature difference to the ambient air of approximately 100° C. With an ambient air temperature of 40° C., this means a temperature on the panel of 140° C. which leaves about 100° C. temperature difference for conductive temperature drops in the clamping device if a maximum temperature of 250° C. is allowed on the anode 56.

Detailed calculations show that if the clamping devices 57 and 58 are made from copper, the arrangement shown in the drawing would approximately correspond to this temperature distribution for normal dimensions of the anode and other dimensions in proportion therewith as indicated by the drawing. The inside heat transfer rate at the boiler portion of the panel 51 is very high. With water as the refrigerant, 1500 watts will be absorbed by the boiling refrigerant in contact with the limited clamping contact area with a temperature drop at the inside surface of only 10 to 20° C. At the condenser portion where the heat transfer rate is still higher and the surface much larger, the inside temperature drop will be insignificant.

In FIGURE 4 is shown another type of mounting for heat conduction from a heat dissipating body to the heat transferring panel. The metal cylinder 59 belonging to an electronic device is mounted through a hole in the panel in a contact area of suitable size. Around the cylinder 59 is placed a heat conducting ring member 60 with its collar 61 in close contact with the cylinder wall and with its flat base 62 bolted to the heat transferring panel through holes in adjacent contact areas. The base may also be brazed or soldered to the panel after copper metallization of the aluminum panel at the contact area.

The panel 51 can be made with the double-walled cavities 54 expanded on both sides or on only one side of the contact areas 53. With one-sided expansion, the other side of the panel will be a plane surface except for the mounting holes. Mounting of heated components can take place on either side.

The double-walled heat transferring panels described above can, according to the invention, be used as a chassis for the mounting of various electronic assemblies such as transmitters, receivers, radio and television sets, etc., in which case holes of various sizes are provided in suitable contact areas for mounting purposes as previously described. The double-walled chassis panel can in the described way be extended to the sides of the assembly and upward for heat dissipation and cooling of the components mounted on the chassis.

Figure 5:
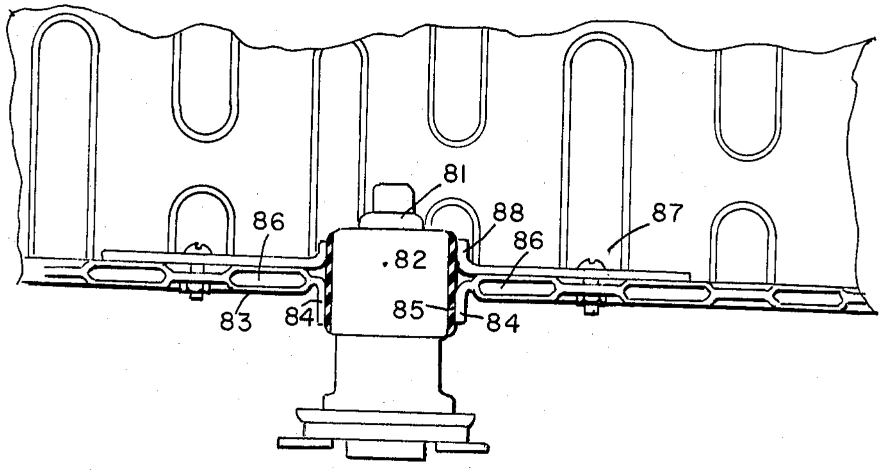
FIGURE 5 is a sectional view of a portion of a mounting system for smaller electronic components.

FIGURE 5 shows a mounting system for smaller electronic components. The electronic component 81 has a cylindrical region 82 which has to be effectively cooled in order to avoid overheating and destruction. Previously, such parts have been provided with a metal radiator and cooled by forced air. According to the invention, the heat dissipating part 82 of the electronic component 81 is instead thermally connected to a double-walled mounting panel 83 comprising a hermetic heat transfer system partly filled with a refrigerant which is in liquid form in the lower portion of the system shown in the figure. Suitable contact areas of the type previously described are provided in the panel 83, a hole is cut into an enlarged contact area, and the edges 84 are bent to form a tight-fitting cooling fin around the heat dissipating body 82 which is provided with an electric insulation 85 made from thin alumina or other ceramic insulator with good heat conductivity. The fin 84 conducts heat directly to the refrigerant filled cavities 86 in the panel 83 surrounding the heat dissipating part and the heat is absorbed by boiling of the refrigerant as previously described. In the figure is shown an additional member 87 comprising a metal ring disc with a tight-fitting collar 88 around the insulated heated cylinder 82. The metal ring disc 87 is bolted or soldered to the heat transferring panel through holes adjacent to contact areas as previously described. Heat is conducted by the ring 87 to the heat transferring panel 83 to provide additional cooling of the electronic device. It is obvious that this clamping method can be used alone or in combination with a similar metal disc on the other side of the panel. The thickness of the disc and the contact area with the panel 83 is determined by well known factors.

Electronic or other components mounted on a heat transferring panel in the way indicated in FIGURES 4 and 5 are often carrying high voltage, as high as 1000 volts or more. The components are in electrical contact with the heat transferring panel; the panel will assume the same voltage. In order to prevent accidents or making it possible to extend the cooling panels to the outside of the high voltage area, the heat transfer panel can be divided into one boiler panel on which the equipment is mounted and a separate condenser panel for the heat dissipation. The two panels can be bolted to each other by non-metallic bolts and separated by a thin layer of alumina or other ceramic insulation material with high heat conductivity. The condenser panel can be of the same width and with its lower end bolted to the upper vertical portion of the boiler panel. The heat transfer will then take place in two steps by means of two thermally inter-connected hermetic systems.

Figure 6:
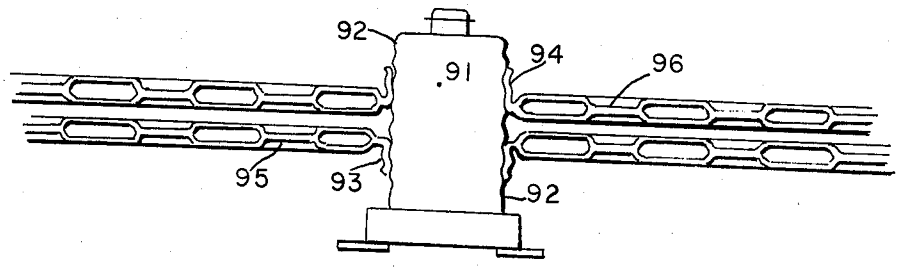
FIGURE 6 is a sectional view of a mounting system employing more than one heat transferring panel in contact with the component to be cooled.

FIGURE 6 illustrates how more than one heat transferring panel or portion of a panel can be thermally connected with a heat dissipating member to be cooled. In this case, the heat dissipating device 91 is provided with an outside thread 92 and screwed in the position shown in the drawing by corresponding thread in the fins 93 and 94 formed by the material in a contact area between the metal walls in the double-walled panels 95 and 96, respectively. In this way, heat is absorbed by two heat transfer systems forming cooling fins to give a large extended surface with substantially no temperature drops.

Figure 8:
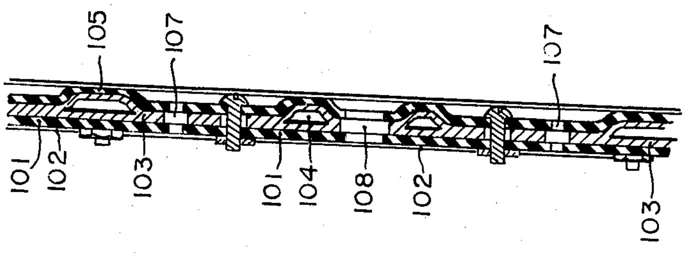
FIGURES 7 and 8 show a printed circuit sandwich mounting panel with built-in cooling system.
Figure 7:
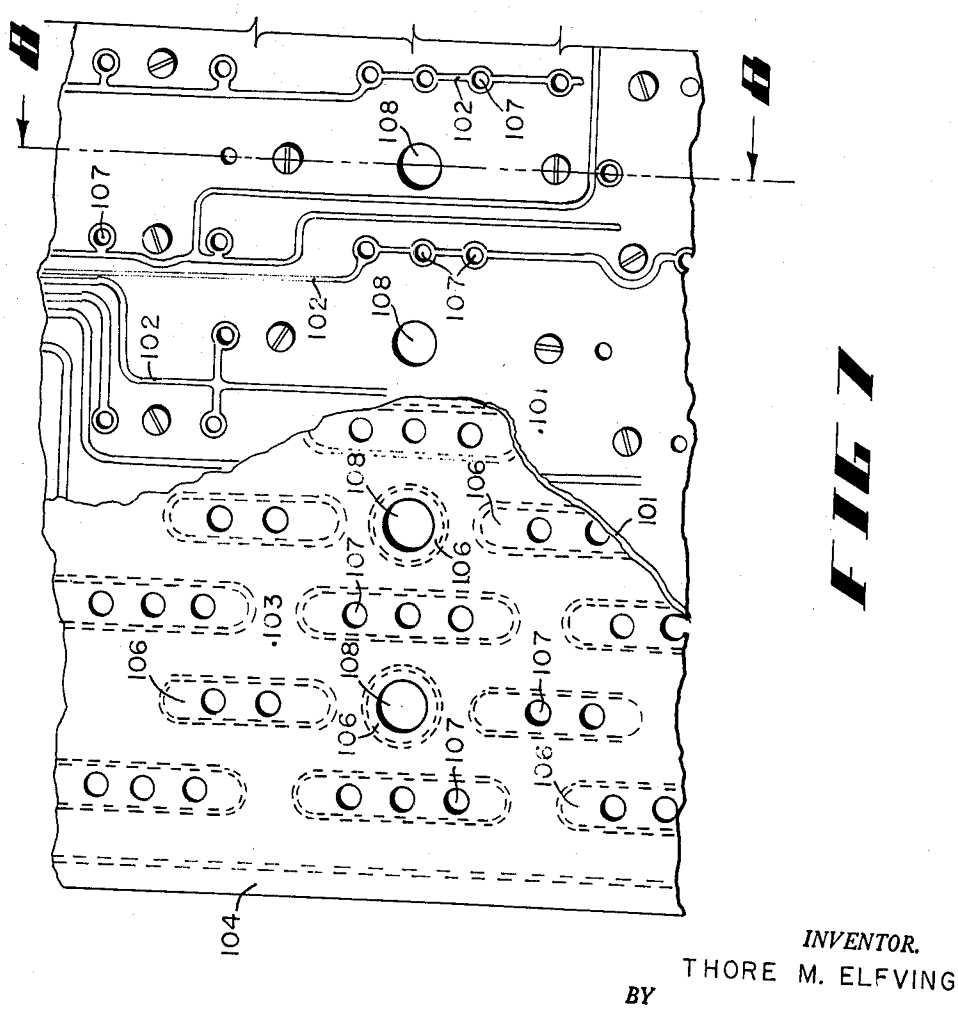

FIGURES 7 and 8 illustrate another embodiment of the invention: a heat transferring mounting panel for so-called printed circuits. Such circuits normally comprise thin copper strips formed by printing a resistive pattern on a copper foil carried by insulaing material, and etching away the exposed copper to form the circuit. The insulating base material such as phenol paper, glass fiber-epoxy laminate or Teflon fiber laminate is in the order of 20 to 100 thousands of an inch or more. The copper foil is applied by a rolling process or by electrolytic methods. The panels or boards usually carry the printed circuit on one side, the soldering side, and the components on the other side, the component side. The circuit formed on one side cannot have any cross-overs. If a circuit cannot be designed and arranged on the soldering side, the circuit can be continued on the component side through holes which connect both sides electrically. Such printed circuits with their many components often develop considerable heat and need cooling by air conditioning of the circuit space, or by forced air. According to the invention, a new type of printed circuit panel is provided whereby the panel itself is heat transferring and extended for heat dissipation from large surfaces in any outside area adjacent to the circuit space.

FIGURE 7 shows a partly sectional view of a printed circuit panel according to the invention as viewed from the soldering or circuit side, while FIGURE 8 shows a sectionalized view of the same panel. Referring to FIGURES 7 and 8, the panel comprises a plastic laminate panel or sheet 101 on which are carried circuit 102 formed in one of the usual ways. This panel is glued, bonded or bolted to the flat side 103 of a one-sided expanded double-walled aluminum panel 104 of the type previously described. The expanded side of the panel 104 represents the component side and is likewise provided with a paper or glass fiber epoxy-plastic laminated sheet material 105 which can be applied before hardening so that it follows the pattern of the expanded metal indicated by dotted lines in FIGURE 8 or applied in flat form on top of the expanded areas of the panel 104 and bolted through holes to the laminated plastic material 102 on the soldering side. The two laminated plastic layers 102 and 105 together with the double-walled aluminum panel 104 form a sandwich with unique characteristics in that it represents a printed circuit panel provided with a built-in automatic cooling system. The panel 104 is partly filled with a refrigerant and forms a heat absorbing hermetic heat transfer system which can be extended in the way previously described for dissipation of the heat absorbed from the circuit and components. The heat dissipating portion of panel 104 can be connected to a thermoelectric heat pump as illustrated in FIGURE 2, or cooled by natural convection or forced air as indicated in other drawings. The double-walled panel 104 is preferably of the roll-bonded type with the two walls joined at suitable areas to form a multitude of inside passages for refrigerant gas or liquid and to provide contact areas 106 through which necessary holes for the printed circuit can be drilled or machined. The aluminum panel 104 must, therefore, be provided with a pattern which matches the module holes 107 on the printed circuit panel 101 and which also allows larger mounting holes 108 for the components as indicated. The silk screen for the manufacture of the roll-bond panel is suitably prepared in conjunction with the lay-out for the printed circuit panel 101. The holes in the panel 104 are of maximum size in relation to the size of the contact area and drilled before assembling the sandwich. The holes in the plastic laminates are drilled after assembly and are of smaller size than the holes in panel 104 so that the edges are electrically insulated as indicated on the drawing. An eyelet can then be put in the hole without electrical shorting.

The assembly of the sandwich is facilitated by guiding holes in the individual plastic and aluminum panels.

A sandwich panel of the type described can handle higher power currents and, therefore, more heat dissipating components than simple panels hitherto used for printed circuits. The plastic laminate material will be effectively cooled together with the circuit and the components thereon whereby better efficiency of the whole circuit is achieved.

FIGURE 7 illustrates by dotted lines a pattern of the expanded aluminum panel as an example only. The contact areas 106 show where module holes 107 or mounting holes 108 can be provided. There is practically no limit to the pattern configuration or the size of the holes and a sandwich panel, according to the invention, can be made to suit a great variety of printed circuit applications. Because of its strength and great heat absorbing and heat equalizing qualities, it can be used as a combined printed circuit and mounting chassis for various electronic apparatus. The double-walled aluminum panel inserted in the sandwich panel is inexpensive and the sandwich panel economical in use. A sandwich panel, according to the invention, can be connected to a mechanical refrigeration system and form an evaporator, in which case one end of the expanded double-walled panel is connected to an expansion valve and the other end connected to a suction of a compressor. The panel is then cooled by refrigerant passing the panel instead of recirculating in the panel. Several such panel systems can be connected to one compressor and cooled simultaneously.

Figure 9:
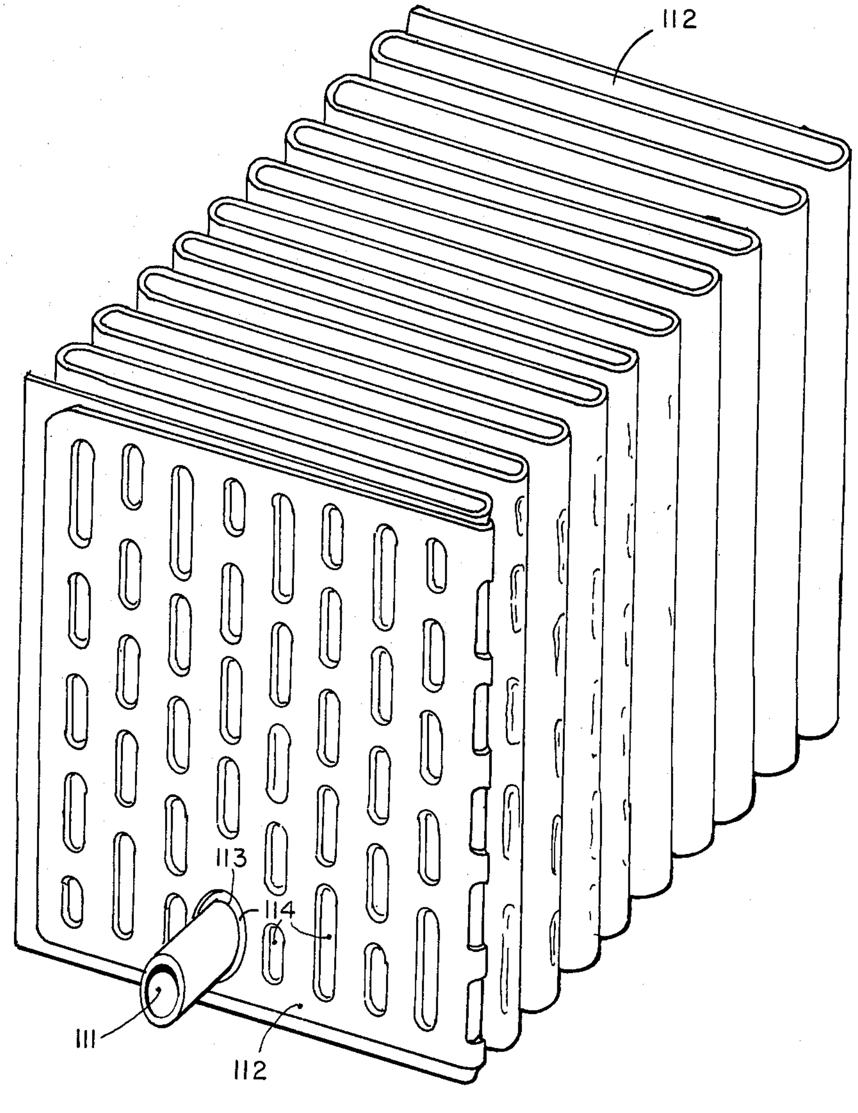
FIGURE 9 is a perspective view of a cooling system using double-walled heat transferring fins.

In FIGURE 9 is shown another embodiment of the invention in the form of a fin pipe without temperature drops. The heat dissipating member 111 in the drawing represented by a pipe is inserted in a series of heat transferring panel sections 112 through holes 113 as illustrated. The panel sections 112 can be made from a single sheet of a roll-bonded double-walled heat transferring panel partly filled with a refrigerant and folded so that the contact areas 114 intended for the holes 113 are in line with each other. A double-walled fin system of this type can be given very large dimensions and effectively cool the pipe 111 without significant temperature drop in the double-walled fins. Different from ordinary fins, the heat dissipating member has to be placed at the lower edge of the "fins" as illustrated. Several fin pipes of this type can be assembled into a fin coil system and forced air circulation applied. Even very large extended fins and large air velocities will not cause any temperature drops. Such a cooling coil system will, therefore, be very effective and compact in relation to its size. Instead of folding a panel to form several fin sections on one pipe, the panel can, according to the invention, remain flat and instead several heat dissipating pipes inserted in the holes 113 provided in the panel. By arranging several such panels parallel to each other at a suitable distance on the pipes, a very effective coil bank of simple design is obtained. The pipes can, according to the invention, be cooled by forced air blown by a fan through the cooling fins in a vertical direction.

It is apparent that the heat transferring mounting panels described, which include a pair of walls bonded over predetermined areas to form a multitude of fluid passages and provide means for attaching devices and components to be cooled, can be used in many applications other than the electronic field. Reference to this field was for purpose of illustration and the invention is not intended to be limited in this respect.

I claim:

1. In combination a heat transferring panel comprising first and second members bonded over predetermined areas to form a double walled hermetically sealed panel having a plurality of interconnected passages, a refrigerant partly filling the passages in said panel, said panel comprising a heat absorbing portion and a heat dissipating portion, said heat dissipating portion being spaced from the heat absorbing portion at a higher horizontal level, at least one heat dissipating electrical component, means for transferring heat from the component to the heat absorbing portion of the panel whereby heat transferred from said object to said heat absorbing portion is transferred to the remote heat dissipating portion by the refrigerant, an extended surface heat dissipating means, a thermoelectric heat pump connected between the heat dissipating portion of said panel and said extended surface heat dissipating means to transfer heat from the heat dissipating portion of the panel to the extended surface heat dissipating means and maintain the heat dissipating portion of the panel at a temperature below the temperature of the extended surface heat dissipating means.

2. In combination, at least one electrical component, an enclosure for housing said electrical component, a heat transferring mounting panel comprising first and second members bonded over predetermined areas to form a double-walled hermetically sealed panel having a plurality of interconnected passages, a refrigerant partly filling said passages in said panel, said panel comprising a heat absorbing portion and a heat dissipating portion, said heat absorbing portion being located to cool electrical components within said cabinet and said heat dissipating portion being exterior of said cabinet at a higher horizontal level to transfer heat absorbed from the electrical component from within said cabinet to the exterior of the cabinet, and means for mounting said electrical component, said mounting means serving to mount said electrical component in said cabinet in heat transfer relationship with said heat absorbing portion.

3. The combination as in claim 2 wherein said means for mounting the electrical component includes a plurality of shelves secured in heat transfer relationship to the heat absorbing portions.

4. The combination as in claim 2 wherein said double-walled member is bent to form at least one shelf within the cabinet.

5. In combination, electrical components, an enclosure for housing said electrical components, a double-walled member formed of first and second conductive members bonded over predetermined areas to form a hermetically sealed panel having a plurality of interconnected passages, a refrigerant partly filling the passages in said panel, said panel having a heat absorbing portion disposed within said enclosure for absorbing heat from electrical components disposed in said enclosure, and a heat dissipating portion exterior of said enclosure for dissipating heat, said dissipating portion located at a higher horizontal level than said heat absorbing portion, and means for mounting the electrical components in heat transfer relationship, said mounting means serving to mount said electrical components with said heat absorbing portion whereby the heat transferred from said components to said heat absorbing portion is transferred to the heat dissipating portion of the panel to be dissipated exterior of said enclosure.

6. The combination as in claim 5 wherein said double-walled panel is bent in the form of an inverted U with the legs of the U disposed in the enclosure and the other portion of the U defining with the ceiling of the enclosure an air duct.

7. The combination as in claim 5 wherein the double-walled panel is bent in the form of an inverted U with the legs of the U disposed in the enclosure and the other portion of the U defining in part the ceiling together with an additional double-walled heat transfer means disposed to remove heat from the heat dissipating ceiling portion of the panel and dissipate the same.

8. The combination as in claim 7 wherein a thermoelectric heat pump is disposed between the ceiling of the U-shaped double-walled panel and the additional double-walled panel.

9. In combination, a plurality of electrical components, a van for housing and transporting said electrical components, a heat transferring mounting panel for mounting and cooling electrical objects within said van, said panel comprising first and second members bonded over predetermined areas to form a double-walled hermetically sealed panel having a plurality of interconnected passages, a refrigerant partly filling the passages in said panel, said panel comprising a heat absorbing portion and a heat dissipating portion, said heat dissipating portion being spaced from the heat absorbing portion at a higher horizontal level and located exterior of said van, said heat absorbing portion extending into said van, means for mounting in heat transfer relationship therewith the electrical components to be cooled, said mounting means serving to mount said electrical components in heat transfer relationship with said heat absorbing portion whereby heat is transferred from the electrical components to the heat absorbing portion and, in turn, transferred by the refrigerant to the heat dissipating portion exterior of said van.

10. The combination as in claim 9 wherein the heat dissipating portion is spaced from the walls of the van to define therewith a duct for the passage of a cooling fluid.

11. In combination, a plurality of electrical components, a heat transferring mounting panel comprising first and second members bonded over predetermined areas to form a double-walled hermetically sealed panel having a plurality of interconnected passages, a refrigerant partly filling said passages in said panel, said panel comprising a heat absorbing portion and a heat dissipating portion, said heat dissipating portion being located spaced from the heat absorbing portion at a higher horizontal level, a printed circuit board having first and second portions disposed on opposite sides of said heat absorbing portion of said panel to sandwich said portion therebetween, a plurality of apertures formed at selected locations in said panel at the bonded areas, apertures formed in said printed circuit board portion to coincide with openings formed in the bonded areas and with each other, and means for mounting said components in electrical contact with each printed circuit board portion.

12. The combination as in claim 11 in which the conductive portions of said printed circuit boards are disposed on the outer surface of the same with the boards in direct physical contact with the heat absorbing portion of the double-walled panel.

References Cited by the Examiner

UNITED STATES PATENTS

| | | | |
|---|---|---|---|
| 2,735,636 | 2/1956 | Snyder | 165—47 |
| 2,881,364 | 4/1959 | Demer | 317—100 |
| 2,912,624 | 11/1959 | Wagner | 317—100 |
| 2,932,953 | 4/1960 | Becket | 62—3 |
| 2,958,021 | 10/1960 | Cornelison | 62—119 |
| 3,035,419 | 6/1962 | Wigert | 62—259 |
| 3,075,360 | 1/1963 | Elfving | 62—3 |
| 3,100,969 | 8/1963 | Elfving | 62—3 |
| 3,100,970 | 8/1963 | Elfving | 62—3 |
| 3,121,188 | 2/1964 | Foster | 317—100 |
| 3,135,321 | 6/1964 | Butt | 317—100 X |

OTHER REFERENCES

German printed application 1,082,605, 6–60.

J. Welsh, "Techniques of Electronic Cooling" in Electrical Manufacturing, 1958.

JOHN F. BURNS, *Primary Examiner.*

DARRELL L. CLAY, *Examiner.*